United States Patent [19]

Kamins

[11] 3,862,852

[45] Jan. 28, 1975

[54] METHOD OF OBTAINING HIGH-QUALITY THICK FILMS OF POLYCRYSTALLINE SILICON FROM DIELECTRIC ISOLATION

[75] Inventor: Theodore I. Kamins, Mountain View, Calif.

[73] Assignee: Fairchild Camera and Instrument Corporation, Mountain View, Calif.

[22] Filed: June 1, 1973

[21] Appl. No.: 365,890

[52] U.S. Cl. .............. 117/106 A, 117/201, 148/174

[51] Int. Cl. .............. C23c 11/06

[58] Field of Search ......... 117/106 A, 201; 148/174

[56] References Cited

UNITED STATES PATENTS

| | | | |
|---|---|---|---|
| 2,501,051 | 3/1950 | Henderson et al. | 117/106 A |
| 2,897,093 | 7/1959 | Eckman | 117/106 A X |
| 3,536,522 | 10/1970 | Cecil et al. | 117/106 A |
| 3,745,043 | 7/1973 | Bradley | 117/106 A X |

*Primary Examiner*—Leon D. Rosdol
*Assistant Examiner*—Harris A. Pitlick
*Attorney, Agent, or Firm*—Alan H. MacPherson; Roger S. Borovoy

[57] ABSTRACT

A polycrystalline silicon film is formed in an environment with minimum oxygen, thereby to reduce or substantially eliminate bowing of the wafer on which the polycrystalline silicon film is formed.

4 Claims, No Drawings

METHOD OF OBTAINING HIGH-QUALITY THICK FILMS OF POLYCRYSTALLINE SILICON FROM DIELECTRIC ISOLATION

BACKGROUND OF THE INVENTION

1. Field of the Invention

This invention relates to polycrystalline silicon and in particular to a method of obtaining a high-quality, thick film of polycrystalline silicon suitable for use in dielectrically isolating integrating circuits and the resulting structure.

2. Prior Art

Dielectric isolation is one technique used to divide an integrated circuit die into a plurality of isolated islands of semiconductor material. Dielectric isolation reduces the parasitic interactions between devices in adjacent islands, improves device speed and increases the radiation resistance of circuits. Dielectrically isolated semiconductor material is disclosed in Frescura U.S. Pat. No. 3,391,023 issued July 2, 1968. In addition, Huffman U.S. Pat. No. 3,393,349 discloses the use of polycrystalline-silicon for isolation and support purposes.

Severe degradation, generally involving plastic deformation, has occasionally been observed during the deposition of thick polycrystallinesilicon layers. This degradation is especially damaging in thicker layers of polycrystalline-silicon and has been encountered whether the silicone was deposited from silane, dichlorosilane, or silicon tetrachloride. The deformation occurs during the deposition, while the entire system is at constant temperature and not during the cooling cycle. Therefore, the degradation cannot be attributed to differences in the thermal coefficients of expansion between the various materials in the structure and must be due to stresses built into the growing layer of polycrystalline silicon. When the degradation is seen, the wafer may become severely warped with a marked change in the structure of the polycrystalline silicon near the edge of the wafer.

The deposition of polycrystalline silicon can be carried out by any of several different well-known processes, including the chemical vapor deposition of silicon by the decomposition of, for example, silane, dichlorosilane, or the reduction of silicon tetrachloride. All of these techniques are well-known and will not be described in further detail.

SUMMARY OF THE INVENTION

This invention overcomes the warping of wafers containing a layer of polycrystalline silicon. The method of this invention allows the deposition of polycrystalline silicon on underlying layers of either an insulating material or a nucleating layer of polycrystalline silicon formed directly on epitaxial silicon without degradation of the wafer due to warpage.

According to this invention, the polycrystalline silicon is deposited in a gaseous environment in which the ratio of oxygen atoms to hydrogen atoms (i.e.,-$[O_2]/[H_2]$) is minimized. For example, $O_2$ concentration should be less than ten parts of $O_2$ per million parts of $H_2$ when the polycrystalline silicon film is deposited at 1,100°C at a rate of 4 microns per minute by the decomposition of dichlorosilane. As the deposition temperature or the deposition rate decreases, the amount of oxygen which can be tolerated likewise decreases. The deposition of polycrystalline silicon by the decomposition of silane or the reduction of silicon tetrachloride likewise must take place in an environment containing no more than a fixed ratio of oxygen atoms to some other gaseous material within the reactor.

This invention makes possible the formation of a polycrystalline silicon film at the relatively low temperatures required to minimize diffusion of impurities at the interface between an epitaxial layer and a semiconductor substrate or at other junctions. In addition, the film deposited using the process of this invention is of high quality, thereby increasing yield and reducing fabrication costs of functioning circuits.

DETAILED DESCRIPTION

Bowing of semiconductor wafers containing a layer of polycrystalline silicon formed on one surface thereof has been a long-standing problem in the semiconductor art. Various explanations have been advanced to explain deformation occurring during the deposition of polycrystalline films. For example, Klokholm and Berry, in an article of the *Journal of Electrochemical Society*, Vol. 115, page 823 (1968) argued that tensile stress in a deposited film (polycrystalline-silicon) may result from the internal rearrangement of deposited atoms behind the growing surface of the film. In the present case the necessity for such internal rearrangement may be related to the ease of surface diffusion of the depositing silicon atoms. A small quantity of adsorbed impurity atoms may severely impede the surface diffusion of deposited silicon atoms. The silicon atoms will then continue to rearrange after they have been covered by subsequently arriving atoms, thereby resulting in the incorporation of a highly stressed layer in the depositing film. The bending moment will be proportional to the product of the stress and the film thickness and will, therefore, become more significant in thicker films. When the bending force exceeds the yield strength of the single-crystal substrate at the deposition temperature, plastic deformation will occur. As the deposition temperature increases, the yield strength of the substrate will probably decrease, but this decrease must be less rapid than the decrease in the bending force. The bending force will decrease because of the increased desorption of the impurity atoms and the increased rate of surface diffusion at higher temperatures. The influence of the rate of deposition of the silicon layer will be more complicated. At lower rates, the surface silicon atoms will have a longer time to rearrange before being buried by subsequently arriving silicon atoms, but the ratio of impurity to silicon atoms may be higher so more impurity atoms may be adsorbed to inhibit surface diffusion.

When severe deformation is observed during the deposition of thick polycrystalline-silicon films, the film is concave upward. On the other hand, when deformation is observed during the formation of deposited epitaxial layers, the warpage of the epitaxial layer is convex upward and is generally less severe than the warpage of an eqaul-thickness polycrystalline film. This reversal of the warpage direction in epitaxial films is reasonable since the inclusion of contaminant atoms in the interstitial positions would lead to compressive stresses and convex curvature. The mechanism of deformation in the polycrystalline-silicon films is believed to be significantly different and may involve the grain boundaries in the polycrystalline material. While the causes of warpage are not completely understood and any theories outlined here are merely postulated at this time, one possibility for the difference in behavior of a polycrystalline-silicon film as opposed to an epitaxial-silicon film is that in the polycrystalline-silicon film contaminant atoms are included at the grain boundaries of the polycrystalline-silicon film. The subsequent migration of these impurities out of the film leaves voids which then collapse causing tensile stresses in the polycrystalline-silicon layer.

Controlled experiments have indicated that the degradation is not related to the type of single-crystal silicon substrate wafer on which the film is deposited. No difference in the severity of degradation attributable to the wafer type used was seen with heavily arsenic-doped wafers with either high or low dislocation densities or with lightly boron-doped wafers. The degradation is not related to the presence of the silicon-dioxide layer beneath the polycrystalline-silicon film since a polycrystalline silicon film nucleated on a thin layer of low-temperature polycrystalline silicon deposited by the decomposition of silane directly on single-crystal silicon shows similar amounts of deformation. Patent application Ser. No. 147,912 filed May 28, 1971 and assigned to the assignee of this application describes the use of a polycrystalline-silicon nucleation layer such as mentioned above.

The process of this invention avoids the formation of warped or bowed wafers as a result of the deposition of a polycrystalline-silicon film. In accordance with this invention, the amount of warpage of the wafer has been discovered to be heavily dependent upon the amount of oxygen contained in the reactor gas stream during the deposition of the polycrystalline-silicon film. In order to determine the relative importance of the deposition rate and the oxygen-to-silicon ratio in the deposition chamber, a series of depositions was carried out with small quantities of oxygen intentionally added to the reactor gas stream. Two depositions were carried out at a deposition rate of 4 microns per minute, while three other depositions were carried out with the deposition rate reduced to 2 microns per minute. The same $[O_2]/[H_2]$ ratio was used for depositions at both rates so that the halving of the deposition rate in the latter run resulted in doubling the oxygen-to-silicon ratio in the reaction chamber. The quality of the deposited polycrystalline-silicon films was markedly better at the higher deposition rate, indicating that the oxygen-to-silicon ratio is more significant to the resultant film quality than is the oxygen partial pressure in the deposition chamber which remained constant for both depositions. In another run, the oxygen flow rate, as well as the dichlorosilane flow rate, was cut in half so that a similar oxygen-to-silicon ratio was used even though the deposition rate was one half that of the earlier run. The film quality of the run deposited at the lower deposition rate was noticeably better than that of the polycrystalline silicon films deposited at the faster rate but the same oxygen-to-silicon ratio. Although the deposited polycrystalline silicon films produced in the latter run were about 10 percent thinner than in the earlier runs, the better film quality indicates that the deposition rate as well as the oxygen-to-silicon ratio is important in determining the quality of the polycrystalline silicon film.

Two mechanisms may be active to decrease the film degradation for a constant oxygen-to-silicon ratio as the deposition rate decreases. First, the adsorbed oxygen atoms will be near the surface of the film for a longer period of time before they are buried by subsequently arriving silicon atoms, and thus these oxygen atoms will have a greater probability of desorbing from (i.e., leaving) the surface of the polycrystalline silicon film. A second argument is related to the surface diffusion of the depositing silicon atoms which normally leads to their rearrangement and restructuring but which is severely impeded by the adsorbed oxygen atoms. As the deposition rate decreases, a longer time is available for the surface silicon atoms to migrate along the surface and reach stable positions even though the same number of oxygen atoms are present on the surface. Consequently, less rearrangement will have to occur after the silicon atoms are buried by subsequently arriving atoms, less stress will arise and less plastic deformation will occur.

Neutron activation analysis of degraded polycrystalline silicon films showed that the oxygen content of the least warped polycrystalline silicon film was about 100 parts of oxygen per million parts of silicon, in a more heavily warped wafer about 140 parts of oxygen per million of silicon, and in a severely warped wafer about 370 parts of oxygen per million parts of silicon.

Although the oxygen concentration increased monotonically with increasing degradation of the wafer, the increase of oxygen concentration did not appear to be linear with degradation. Possibly some of this discrepancy is due to experimental errors. However, the amount of degradation appears to increase more than linearly as oxygen is added to the reactor gas stream, indicating that the degradation process accelerates once it starts. Once the edges of the wafers start lifting from the susceptor on which they are placed during the deposition of the polycrystalline silicon film, these edges begin to cool, thereby probably increasing the quantity of oxygen included in the film. The presence of approximately 100 parts of oxygen per million parts of silicon in the least degraded sample indicates the need for minimizing the oxygen content in the reactor during the formation of the polycrystalline silicon film.

In one experiment to determine whether other gases could cause similar degradation, controlled amounts of either nitrogen or oxygen were added to the hydrogen/-dichlorosilane gas stream during the deposition of a 250 micron-thick, polycrystalline silicon film at 1,100° C (temperature is corrected for absorption in the quartz and safety glass and for the emissivity of the silicon wafer) and a rate of 4 microns per minute. The addition of 30 parts of nitrogen per million parts of hydrogen did not induce any noticeable degradation of the resulting polycrystalline silicon film, while the addition of about 20 and 44 parts of oxygen per million parts of hydrogen caused moderate and severe degradation, respectively.

The effect of temperature on the amount of oxygen which can be tolerated in the reactor during the deposition of the polycrystalline silicon film is significant. Appreciably degradation is seen at higher deposition temperatures with the same magnitude of contamination. This increase in film quality with increasing deposition temperature has been seen in different reactors and with silane, and silicon tetrachloride as well as with dichlorosilane.

EXAMPLE

A polycrystalline-silicon film was produced by placing a silicon substrate (260 microns thick ±15 microns) containing on both surfaces a silicon dioxide layer 0.9 microns thick in a reactor, heating the substrate to a true temperature of 1,100° C and then depositing a polycrystalline silicon layer on the silicon dioxide by the decomposition of dichlorosilane in a hydrogen atmosphere. The flow rate of hydrogen was 67 liters per minute and of dichlorosilane 1.3 liters per minute. The deposition rate was 4 microns per minute and the deposition continued for 55 minutes to yield a polycrystalline-silicon layer 220 microns thick. The deposition was carried out in an environment containing minimum oxygen. The resulting structure exhibited no appreciable bowing.

What is claimed is:

1. The improved method of depositing a polycrystalline silicon film on a silicon wafer comprising:

a. decomposing a silicon compound selected from the class consisting of silanes, chlorosilanes and silicon tetrochloride in the presence of hydrogen to form silicon atoms;

b. depositing the silicon atoms thus formed in polycrystalline form on a silicon wafer; and c. maintaining the ratio of oxygen atoms to hydrogen atoms during the said decomposition and deposition to less than 20 parts oxygen per million parts hydrogen, thereby minimizing degradation of the wafer due to warpage.

2. The method of claim 1 wherein said deposition of polycrystalline silicon takes place by the decomposition of dichlorosilane.

3. The method of claim 2 wherein said dichlorosilane flows at a rate of 1.3 liters per minute, said hydrogen flows at a rate of 67 liters per minute and the polycrystalline silicon is formed on a substrate held at a temperature of 1,100° C.

4. The method of claim 1 wherein the ratio of oxygen to hydrogen is held beneath ten parts of oxygen to each million parts of hydrogen.

* * * * *